(12) United States Patent
Chang et al.

(10) Patent No.: US 8,675,942 B2
(45) Date of Patent: Mar. 18, 2014

(54) PRIOR ENHANCED COMPRESSED SENSING (PRINCE-CS) RECONSTRUCTION FOR DYNAMIC 2D-RADIAL CARDIAC MRI

(75) Inventors: Ti-chiun Chang, Princeton Junction, NJ (US); Mariappan S. Nadar, Plainsboro, NJ (US); Jens Gühring, Erlangen (DE); Michael Zenge, Nürnberg (DE); Kai Tobias Block, New York, NY (US); Peter Speier, Erlangen (DE); Edgar Müller, Heroldsbach (DE); Michael S. Hansen, Silver Spring, MD (US)

(73) Assignees: Siemens Aktiengesellschaft, Munich (DE); National Institutes of Health, Rockville, MD (US)

( * ) Notice: Subject to any disclaimer, the term of this patent is extended or adjusted under 35 U.S.C. 154(b) by 81 days.

(21) Appl. No.: 13/280,994

(22) Filed: Oct. 25, 2011

(65) Prior Publication Data
US 2012/0148129 A1   Jun. 14, 2012

Related U.S. Application Data

(60) Provisional application No. 61/410,448, filed on Nov. 5, 2010.

(51) Int. Cl.
*G06K 9/00* (2006.01)
(52) U.S. Cl.
USPC ............................................. 382/131
(58) Field of Classification Search
None
See application file for complete search history.

(56) References Cited

U.S. PATENT DOCUMENTS

| | | | |
|---|---|---|---|
| 6,853,191 B1 * | 2/2005 | Miller et al. | 324/309 |
| 7,418,287 B2 * | 8/2008 | Tsao et al. | 600/410 |
| 7,864,999 B2 | 1/2011 | Chang et al. | |
| 7,903,858 B2 * | 3/2011 | Chang et al. | 382/131 |
| 8,473,028 B2 * | 6/2013 | Mitsouras et al. | 600/410 |
| 2003/0048937 A1 * | 3/2003 | Gullberg et al. | 382/131 |
| 2003/0080749 A1 * | 5/2003 | Al-Janabi et al. | 324/470 |
| 2007/0195932 A1 * | 8/2007 | Nakaura et al. | 378/98.12 |
| 2008/0009705 A1 * | 1/2008 | Furudate | 600/410 |
| 2008/0247503 A1 * | 10/2008 | Lauritsch et al. | 378/4 |
| 2009/0263001 A1 * | 10/2009 | Ding et al. | 382/131 |
| 2011/0090309 A1 * | 4/2011 | Suzuki et al. | 348/43 |
| 2011/0148413 A1 * | 6/2011 | Miyazaki et al. | 324/309 |
| 2012/0095326 A1 * | 4/2012 | Miyazaki | 600/413 |

OTHER PUBLICATIONS

Application of the Karhunen-Lohe Transform to 4D Reconstruction of Cardiac Gated SP.ECT Images Manoj V. Narayananl; Aug. 1999.*

(Continued)

*Primary Examiner* — Nancy Bitar
(74) *Attorney, Agent, or Firm* — Donald B. Paschburg

(57) ABSTRACT

A reconstructed image is rendered from a set of MRI data by first estimating an image with an area which does not contain artifacts or has an artifact with a relative small magnitude. Corresponding data elements in the estimated image and a trial image are processed, for instance by multiplication, to generate an intermediate data set. The intermediate data set is transformed and minimized iteratively to generate a reconstructed image that is free or substantially free of artifacts. In one embodiment a Karhunen-Loeve Transform (KLT) is used. A sparsifying transformation may be applied to generate the reconstructed image. The sparsifying transformation may be also not be applied.

18 Claims, 6 Drawing Sheets

(56) References Cited

OTHER PUBLICATIONS

Fang et al (MR image reconstruction from sparse radial samples using Bregman iteration)2006,PRoc international Society Mag Reson.MEd.14.*

B. Wu et al., Prior estimate-based compressed sensing in parallel MRI, first published on-line on Oct. 28, 2010, MRM vol. 65, issue 1, p. 83-95, Jan. 2011.

T. Sorensen et al. Real-Time Reconstruction of Sensitivity Encoded Radial Magnetic Resonance Imaging Using a Graphics Processing Unit, IEEE T-MI, 2009, p. 1974-85.

Fessler et al. Nonuniform Fast Fourier Transforms Using Min-Max Interpolation, IEEE T-SP, 51(2):560-74, Feb. 2003.

Becker et al., NESTA: A Fast and Accurate First-order Method for Sparse Recovery, SIAM J. on Imaging Sciences, 2011 p. 1-39.

A. Beck and M Teboulle: A fast iterative shrinkage-thresholding algorithm for linear inverse problems, SIAM J. on Imaging Sciences 2 (1), p. 183-202, Mar. 4, 2009.

J. I. Jackson, et al., Selection of a Convolution Function for Fourier Inversion Using Gridding, *IEEE Trans. Med. Imag.*, 10(3), 473-478, 1991.

T-C Chang, et al., MR Image Reconstruction from Sparse Radial Samples Using Bregman Iteration, *Proc. 14th. Annual Meeting of ISMRM*, Seattle, WA, 2006.

\* cited by examiner

Conventional CS Solves:

$$\arg\min_{f} \|\phi(f)\|_1, \quad \text{s.t.} \|Ef - y\|_2 < \varepsilon \qquad (1)$$

$f$ : image sequence to be reconstructed
$\phi$ : sparsifying transform
$E$ : Encoding matrix
$y$ : measurement data
$\varepsilon$ : data fidelity parameter

FIG. 5

PRINCE-CS includes an additional element-wise multiplication

$$\arg\min_{f} \|\phi(g \bullet f)\|_1, \quad \text{s.t.} \|Ef - y\|_2 < \varepsilon \qquad (2)$$

$g$ : Smoothed and alias-free estimate of $f$, which can be obtained from non-overlapping spokes in the dynamic 2d radial $k$-space trajectory

Mathematical tools for solving (2)

(a) Reweighted $\ell 1$ minimization to enhance sparsity: Solving $$\arg\min_{f} \|W_r \phi(g \bullet f)\|_1, \quad \text{s.t.} \|Ef - y\|_2 < \varepsilon \qquad (3)$$

$W_r$ : Weighting factor that changes for each reweighting iteration
Hereafter, to simplify notation, treat $f \leftarrow g \bullet f$.

(b) Non-uniform Fast Fourier Transform (NUFFT)

(c) NESTA algorithm (with continuation) or FISTA

PRIOR ENHANCED COMPRESSED SENSING (PRINCE-CS) RECONSTRUCTION FOR DYNAMIC 2D-RADIAL CARDIAC MRI

STATEMENT OF RELATED CASES

This application claims the benefit of U.S. Provisional Application No. 61/410,448 filed Nov. 5, 2010, which is incorporated herein by reference.

BACKGROUND OF THE INVENTION

The present invention relates generally to medical imaging, and more particularly to iterative reconstruction of images.

Magnetic Resonance Imaging (MRI) has become a well-established medical diagnostic tool for imaging structures within the body of a patient. Image quality may be characterized by a host of parameters, including resolution, field of view, contrast, edge definition, and artifacts (for example, ghosts and streaks). Under a broad range of conditions, image quality improves with increasing data acquisition time. If the data acquisition time is increased, however, the patient is subjected to a longer scan time, which increases patient discomfort. In some instances, long scan times may actually degrade image quality because of movement of the region of interest during the scan. Short scan times are also necessary for near-real-time measurements, such as used in functional MRI. There is, thus, a trade-off between image quality and scan time.

Images are displayed on physical media; for example, emulsions on film or pixels on a monitor. The normal physical world may be referred to as real space. In one method for producing high-quality images, MR signals are captured in k-space. In some fields of study, k-space is also referred to as spatial-frequency domain. In general terms, data values in real space are then generated by taking the inverse Fourier transform of data values in k-space. In general, MR signals are not measured as a continuous function of position in k-space. They are sampled at discrete k-values. Subject to specific constraints and boundary conditions, image quality generally improves as the density and range of discrete k-space sampling points are increased. Recording a large number of samples, however, has disadvantages. One is the extended scan time discussed above. The other is low temporal resolution.

To reduce data acquisition time, MRI data are often intentionally under-sampled. This will, however, often lead to reduced signal-to-noise ratio (SNR) and to image degradation. Various techniques have been developed to enhance the image quality reconstructed from under-sampled data, but they require extended computational time and high memory usage. What is needed is a method which reduces computational time and memory usage for generating high quality real-space images from under-sampled k-space data.

BRIEF SUMMARY OF THE INVENTION

Aspects of the present invention provide systems and methods to provided prior enhanced compressed sensing (prince-cs) reconstruction for dynamic 2d-radial cardiac MRI.

An image is rendered from a set of MRI data by first estimating an artifact-free image or image data by using non-overlapping temporal samples. Corresponding data elements in the estimated image and trial images are processed, for instance by multiplication, to generate an intermediate data set. The intermediate data set is transformed and minimized iteratively to generate reconstructed images that have high temporal resolution and are free or substantially free of artifacts. These and other advantages of the invention will be apparent to those of ordinary skill in the art by reference to the following detailed description and the accompanying drawings.

In accordance with an aspect of the present invention a method is provided for generating a reconstructed image of an object from image data obtained with a medical imaging system, comprising a processor receiving the image data obtained with the medical imaging system by radial imaging, the processor generating an estimate image by reconstructing a substantially artifact-free image from non-overlapping image data, the processor generating an intermediate data set by performing an element-wise operation on corresponding data elements in an iterative image and the estimate image, and the processor generating the reconstructed image by minimizing a transform of the intermediate data set.

In accordance with a further aspect of the present invention a method is provided, wherein the iterative image is updated in an iterative step.

In accordance with yet a further aspect of the present invention a method is provided, wherein the image data obtained with the medical imaging system by radial imaging is dynamic 2D-radial cardiac image data.

In accordance with yet a further aspect of the present invention a method is provided, wherein the transform is a Karhunen-Loeve transform that does not include a spatial sparsifying transform.

In accordance with yet a further aspect of the present invention a method is provided, wherein the transform is a Karhunen-Loeve transform that does include a spatial sparsifying transform.

In accordance with yet a further aspect of the present invention a method is provided, wherein the element-wise operation is a multiplication.

In accordance with yet a further aspect of the present invention a method is provided, wherein the estimate image is generated by combining a plurality of interleaved samples of the object.

In accordance with yet a further aspect of the present invention a method is provided, wherein the minimizing is represented by an expression $\arg\min_f\{\|\phi(g \cdot f)\|_1 \text{ subject to } \|Af - y\|_2 \leq \epsilon\}$, wherein f represents the iterative image, g represents the estimate image, · represents the element-wise operation, $g \cdot f$ represents the intermediate data set, $\phi(g \cdot f)$ represents the transform of the intermediate data set, $\|.\|_1$ represents an L1 norm, $\|.\|_2$ represents an L2 norm, A represents a non-uniform Fourier operator that maps an image into k-space, y is measured k-space data and $\epsilon$ is a parameter that accounts for deviation between measured and ideal data.

In accordance with yet a further aspect of the present invention a method is provided, wherein the estimate image is obtained from non-overlapping spokes in a 2D radial k-space trajectory.

In accordance with yet a further aspect of the present invention a method is provided, wherein the estimate image is a smoothed and substantially alias-free estimate of f.

In accordance with another aspect of the present invention a system is provided to generate a reconstructed image of an object from image data obtained with a medical imaging system, comprising a memory enabled to store data, a processor, enabled to execute instructions to perform the steps: receiving the image data obtained with the medical imaging system by radial imaging, generating an estimate image by reconstructing a substantially artifact-free image from non-overlapping image data, generating an intermediate data set by performing an element-wise operation on corresponding data elements in an iterative image and the estimate image and generating the reconstructed image by minimizing a transform of the intermediate data set.

In accordance with yet another aspect of the present invention a system is provided, wherein the iterative image is updated in an iterative step.

In accordance with yet another aspect of the present invention a system is provided, wherein the image data obtained with the medical imaging system by radial imaging is dynamic 2D-radial cardiac image data.

In accordance with yet another aspect of the present invention a system is provided, wherein the transform includes a Karhunen-Loeve transform and does not include a spatial sparsifying transform.

In accordance with yet another aspect of the present invention a system is provided, wherein the transform includes a Karhunen-Loeve transform and does include a spatial sparsifying transform.

In accordance with yet another aspect of the present invention a system is provided, wherein the element-wise operation is a multiplication.

In accordance with yet another aspect of the present invention a system is provided, wherein the estimate image is generated by combining a plurality of interleaved samples of the object.

In accordance with yet another aspect of the present invention a system is provided, wherein the minimizing is represented by an expression arg $\min_f \{\|\phi(g \cdot f)\|_1$ subject to $\|Af-y\|_2 \leq \epsilon\}$, wherein f represents the iterative image, g represents the estimate image, $\cdot$ represents the element-wise operation, g·f represents the intermediate data set, $\phi(g \cdot f)$ represents the transform of the intermediate data set, $\|.\|_1$ represents an L1 norm, $\|.\|_2$ represents an L2 norm, A represents a non-uniform Fourier operator that maps an image into k-space, y is measured k-space data and $\epsilon$ is a parameter that accounts for deviation between measured and ideal data.

In accordance with yet another aspect of the present invention a system is provided, wherein the estimate image is obtained from non-overlapping spokes in a 2D radial k-space trajectory.

In accordance with yet another aspect of the present invention a system is provided, wherein the estimate image is a smoothed and substantially alias-free estimate off.

BRIEF DESCRIPTION OF THE DRAWINGS

FIG. 5 illustrates steps in accordance with various aspects of the present invention.

DETAILED DESCRIPTION

Figure 1:
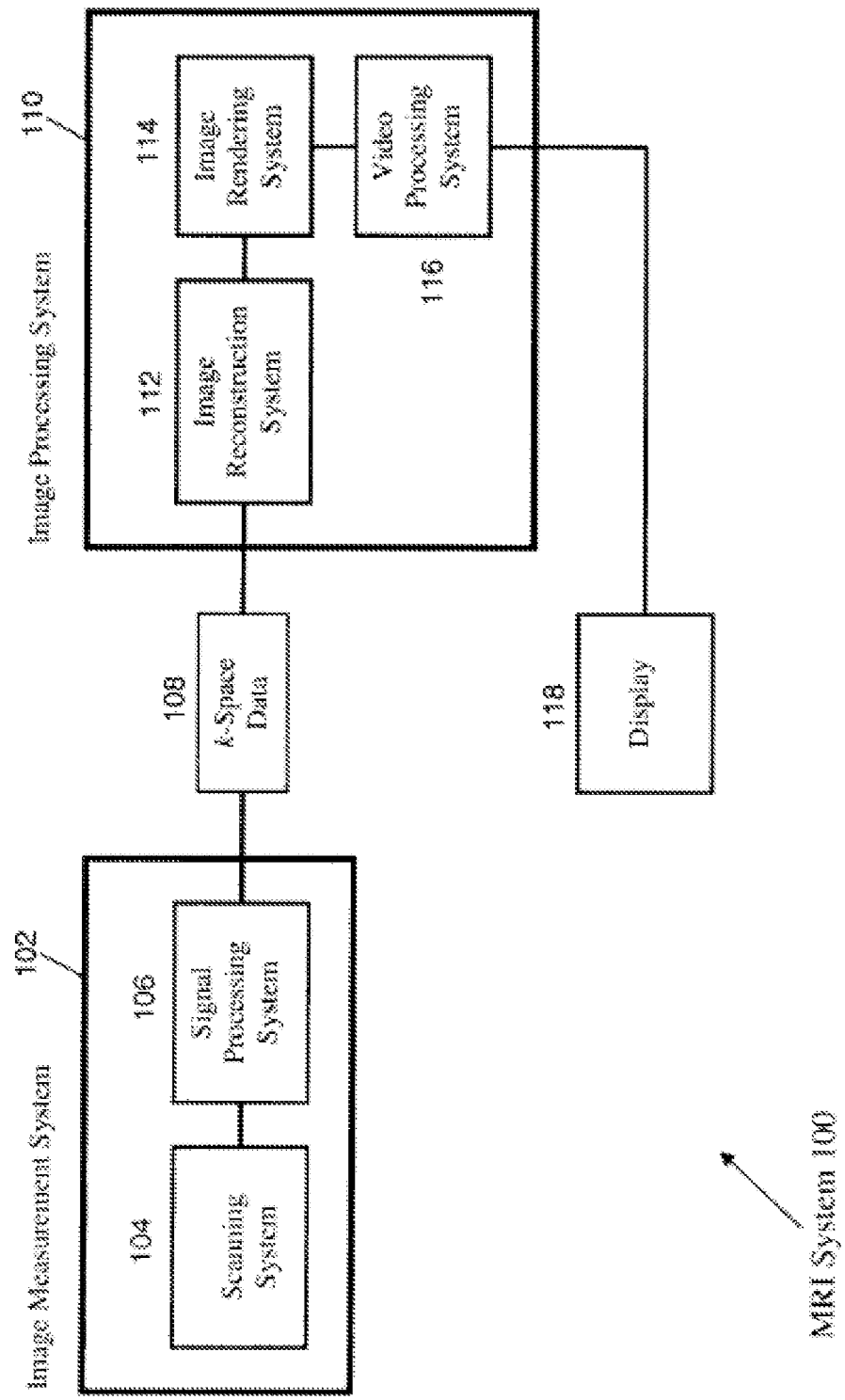
FIG. 1 shows a high-level schematic of an MRI system.

FIG. 1 shows a high-level schematic of the functional architecture of a representative imaging system in accordance with an aspect of the invention. In the example shown in FIG. 1, the imaging system is MRI system 100. Embodiments apply to other modalities. MRI system 100 comprises image measurement system 102, image processing system 110, and display 118. Image measurement system 102 may include scanning system 104 and signal processing system 106. Scanning system 104 includes the MRI scanner and associated instrumentation and software. The outputs of scanning system 104 are radio-frequency (RF) signals which are fed into signal processing system 106. Signal processing system 106 includes hardware and software, including processors, which converts the RF signals to k-space data 108, which is discussed further below.

The k-space data 108 is then fed into image processing system 110, which may include image reconstruction system 112, image rendering system 114, and video processing system 116. Image reconstruction system 112, further discussed below, transforms k-space data 108 into image-space data, which may be a two-dimensional (2-D) or three-dimensional (3-D) dataset. Herein, image space refers to real space. Herein, image reconstruction refers to the transformation of k-space data to image-space data. The image-space data is then mapped by image rendering system 114 into optical data for further video processing. For example, in a monochrome display, the image-space data may be mapped into the luminance values of pixels. In a color display, image-space data may be mapped into the luminance and false-color values of pixels. Video processing system 116 transforms the output optical data from image rendering system 114 into signals which drive pixels on display 118, which displays the image viewed by a user.

As discussed above, MR signals captured and processed by image measurement system 102 are output as k-space data 108. In general terms, data values in image space are then generated by taking the inverse Fourier transform of k-space data 108. In general, MR signals are not measured as a continuous function of position in k-space. They are sampled at discrete k-values. Subject to specific constraints and boundary conditions, image quality generally improves as the density and range of discrete k-space sample points are increased. For other modalities, k-space is also referred to as spatial-frequency domain.

Coordinates of points in k-space may be specified with respect to a 3-D Cartesian grid, analogous to the common x-y-z Cartesian grid in real space. For MRI analysis, the axes are $k_x$=frequency (also called readout), $k_y$=phase encoding, and $k_z$=slice selection. Alternative coordinate systems, such as polar coordinates, may also be used. The locus of points in k-space along which data is sampled is referred to as the scan trajectory. The simplest trajectories are linear. For example, in a 2-D scan, a value of $k_y$ is held fixed while data is sampled at different values of $k_x$. The linear scans along $k_x$ are then repeated for other fixed values of $k_y$. A disadvantage of linear Cartesian scans is that the scan pattern is relatively slow in the $k_y$ direction.

Acquisition speed may be increased by various techniques. For example, radial or spiral trajectories may be used instead of linear ones. As discussed above, k-space values may be intentionally under-sampled. Images reconstructed from under-sampled data, however, are often degraded by severe artifacts and low SNR. Image quality may be enhanced via iterative MR reconstruction schemes. (See, for example, T-C Chang, et al., MR Image Reconstruction from Sparse Radial Samples Using Bregman Iteration, *Proc. 14th. Annual Meeting of ISMRM*, Seattle, Wash., 2006, which is incorporated by reference.) In these schemes, the $L_1$ norm of the sparse representations of the image-space data is minimized, subject to the constraint of k-space data fidelity. A sparse representation of an image is a set of transformed domain coefficients that has much fewer non-zero values than the image of interest.

Using the set of coefficients, the image of interest may be constructed, rendered, and displayed.

The problem can be expressed as:

$$\min_f \|\varphi(f)\|_1 \text{ subject to } Af = y, \quad (E1)$$

where f is the image-space data arranged in a vector form. φ(.) transforms the image-space data into a sparse representation, y is the measured k-space data arranged in a vector form, and matrix A is a Fourier operator that maps the image-space data into k-space data. Here, $\|\cdot\|_p$ refers to the $L_p$ norm. The image is rendered from f-values which solve the minimization E1. The variable f is also called a trial image. Because f is updated during iterative steps, it may also be called an iterative image.

One other way of expressing E1 is:

$$\arg\min_f \{\|\phi(f)\|_1 \text{ subject to } \|Af - y\|_2 \le \epsilon\},$$

wherein ε is a parameter that accounts for deviation between measured and ideal data.

The optimization problem of E1 is equivalent to the unconstrained optimization:

$$\min_f \{\psi(f)\}, \quad (E2)$$

$$\text{with } \psi(f) = \lambda\|\varphi(f)\|_1 + \|Af - y\|_2^2.$$

Here, ψ(f) is a cost functional, λ≥0 is a Lagrange multiplier, and $\|Af-y\|_2^2$ is a data fidelity term. In an embodiment, an iterative non-linear conjugate gradient (CG) method is used to calculate f-values which solve the minimization E2. The solution at iteration k is $$f_{k+1} = f_k + \alpha_k d_k,$$

where $$d_k = -\nabla\psi(f_{k+1}) + \beta_{k+1} d_k \quad (E4)$$

$$d_0 = -\nabla\psi(f_0) \quad (E5)$$

$\beta_{k+1}$ is the update direction:

$$\beta_{k+1} = \frac{|\nabla\psi(f_{k+1})|^2}{|\nabla\psi(f_k)|^2}, \quad (E6)$$

$\alpha_k$ is the step size:

$$\alpha_k = \arg\min_\alpha \psi(f_k + \alpha d_k). \quad (E7)$$

In E7, a search for $\alpha_k$ may be performed with a backtracking line search method. An example of a backtracking line search method is given by the pseudo-code:
given a descent direction d for the energy functional ψ, γ∈(0,0.5), δ∈(0,1); initializing α:=1;
and while ψ(f+αd)>ψ(f)+γα∇ψ(f)$^T$d, setting α:=δα.

Using this formulation, the number of iterations necessary for convergence is high. The cost of each CG iteration is high as well, due to the non-Cartesian nature of the trajectory. The gradient of the data fidelity term in E2 is A$^\dagger$(Af-y). Fast Fourier transform (FFT) is not directly applicable when applying the Fourier operator A to the image-space data and its adjoint A$^\dagger$ to the k-space data. Conventionally, gridding and inverse gridding methods are used. (See, for example, J. I. Jackson, et al., Selection of a Convolution Function for Fourier Inversion Using Gridding, *IEEE Trans. Med. Imag.*, 10(3), 473-478, 1991, which is incorporated by reference.) The gridding accuracy trades off computational speed subject to the choice of gridding kernel. Furthermore, the use of a look-up table in the gridding methods trades off memory usage for computational speed. As a result, using gridding and inverse gridding for the data fidelity term is expensive for 2-D applications, and may be prohibitively high for 3-D applications.

Image reconstruction time may be greatly reduced by embodiments of the invention. In an embodiment, a k-space weighting, equivalently interpreted as a density compensation function (DCF), is applied to the $L_2$ norm data fidelity term in E2. The minimization problem of E2 is then modified to $$\min_f \{\lambda\|\varphi(f)\|_1 + \|W(Af - y)\|_2^2\}, \quad (E8)$$

where W is a diagonal weighting matrix. The modified cost functional is $\lambda\|\phi(f)\|_1 + \|W(Af-y)\|_2^2$. The matrix D=W$^\dagger$W can be proportional to the density compensation function, which is well-known in gridding method. The weighting makes the residual nearly perpendicular to the descent direction at each iteration, and thus enables near optimal convergence. In an embodiment, the product of the Fourier operator and its adjoint is a block-Toeplitz matrix, and its operation on vectors may be evaluated by FFT. Gridding and inverse gridding time are reduced. The storage of the gridding look-up table is also eliminated.

In an embodiment, total variation (TV) may be used as $\|\phi(.)\|_1$ due to its convexity, simplicity, and effectiveness for processing medical images. The models represented by E2 and E8 then become total variation regularization models, which are advantageous in a wide variety of restoration problems, such as denoising, deblurring, blind deconvolution, and in-painting. TV norm is effective in reducing oscillations without penalizing discontinuities. Thus, it may mitigate streaking artifacts while preserving edge definition. By selecting different values for λ, a user may select the level of detail desired in the reconstructed image. The Lagrange multiplier λ is usually chosen relatively small to emphasize the data fidelity term and avoid artifacts introduced by over-penalizing the TV norm. Examples of artifacts include stair-casing (blocking) and degradation of contrast, geometry, and texture. The convergence of the algorithm is, therefore, largely decided by the data fidelity term.

U.S. Pat. No. 7,864,999 issued on Jan. 4, 2011 to Chang et al. and U.S. Pat. No. 7,903,858 issued on Mar. 8, 2011 to Chang et al., which are both incorporated herein by reference, disclose methods and systems for processing image data such as MRI image data.

In one embodiment of the present invention the image data obtained from a medical imaging device is acquired in a non-Cartesian manner, but more specifically in a radial manner. Even more specifically, the image data is dynamic 2D-radial cardiac MRI image data.

According to compressed sensing (CS) theory, when the signal is sparse or can be sparsified by a certain transformation, samples that are fewer in number than those satisfying the Nyquist rate can be used to recover an image from MRI data accurately. In practice, under the scenario of measurement imperfection and noise, the required samples to recover an acceptable signal fall below the promise of CS. In the sense of Bayesian framework, the sparsity is the only prior knowledge exploited by the CS applications.

Next, it will be shown that more knowledge about the application at hand helps CS to do better. A paper by B. Wu et al., Prior estimate-based compressed sensing in parallel MRI, first published on-line on 28 Oct. 2010, MRM Vol. 65, issue 1, p 83-95, January 2011 which is incorporated herein by reference and shows the benefit of prior estimate for CS. Here, it is demonstrated how the CS-based reconstruction of dynamic 2D-radial cardiac MRI can take advantage of the prior estimate from the temporally combined k-space samples.

In the compressed sensing approach in accordance with an aspect of the present invention, the constraint optimization is articulated as:

$$\arg\min_f\{\|\phi(f)\|_1 \text{ subject to } \|Af-y\|_2 \leq \epsilon\}. \quad E9$$

Here, f is a trial image; $\phi(f)$ transforms f into a sparse representation: y is the measured k-space data; A is a Fourier operator that maps the image into k-space; and $\epsilon$ is a parameter that accounts for deviation between the measurement and ideal data. Eq. E9 is the conventional CS formulation that solely relies on the sparsity assumption. Research focus has generally been directed to finding the most suitable transformation $\phi$ for different applications so as to meet the assumption, but not much has been done for how additional prior knowledge can be utilized. Because the CS framework aims at de-aliasing for undersampled reconstruction, if there is an oracle providing information where the artifacts are, as in the case of Cartesian parallel imaging, the reconstruction task would be relieved by focusing on the known locations.

For non-Cartesian or CS applications, as the aliasing artifacts are signal dependent and/or randomized, such information is not available. Fortunately in the 2D radial cardiac MRI with golden ratio trajectory, one can reconstruct a nearly artifact-free high spatial resolution image g from all the samples at different phases. This image is different from the trial reconstruction object at each time point with 1) undersampled artifacts and 2) structure changes due to motion.

The k-t SENSE system, as described in T. Sorensen et al. Real-Time Reconstruction of Sensitivity Encoded Radial Magnetic Resonance Imaging Using a Graphics Processing Unit, IEEE T-MI, 2009, page 1974-85, which is incorporated by reference, discloses a signal variance estimate in the regularization term. Here without having to undergo any training, one performs a simple filter on image data g to obtain a prior estimate $\tilde{g}$ which can be called an estimate image for the rough location of the artifact-free area, and which is applied to Eq. E9 as:

$$\arg\min_f\{\|\phi(\tilde{g}\cdot f)\|_1 \text{ subject to } \|Af-y\|_2 \leq \epsilon\}, \quad E10$$

wherein f represents the trial image; $\tilde{g}$ represents the estimate image; · represents the element-wise operation which can be a multiplication; $\tilde{g}\cdot f$ represents an intermediate data set generated from $\tilde{g}$ and f, $\phi(\tilde{g}\cdot f)$ represents the transform of the intermediate data set; $\|\cdot\|_1$ represents an L1 norm; $\|\cdot\|_2$ represents an L2 norm; A represents a Fourier operator that maps an image into k-space; y is measured k-space data; and $\epsilon$ is a parameter that accounts for deviation between measured and ideal data.

In one embodiment of the present invention the operation · denotes element-wise multiplication.

This new formulation E10 is referred to as the prior enhanced CS (PRINCE-CS).

In experiments with dynamic 2D radial cardiac MRI, it was found that choosing $\phi(f)$ to be the Karhunen-Loeve transform (KLT), applied in the temporal dimension, yields excellent balance between the artifact and noise suppression and detail preservation, even without the use of spatial sparsifying transform. Intuitively, the introduction of $\tilde{g}$ reduces the artifact magnitude in the forward imaging model because it was estimated from sufficient samples so that virtually or substantially no aliasing artifact is present, or at least noticeable fewer or at least substantially fewer artifacts are present, or at least an artifact magnitude is much smaller as compared to not introducing $\tilde{g}$. This enables the optimization procedure to mitigate the artifacts more confidently while reducing the cost function and satisfying data fidelity. In experiments, it was shown that this prior estimate helps to improve the reconstruction results for different choices and combination of transforms, such as a Discrete Fourier Transform, a Karhunen-Loeve Transform and a reduced Haar Transform.

Figure 6:
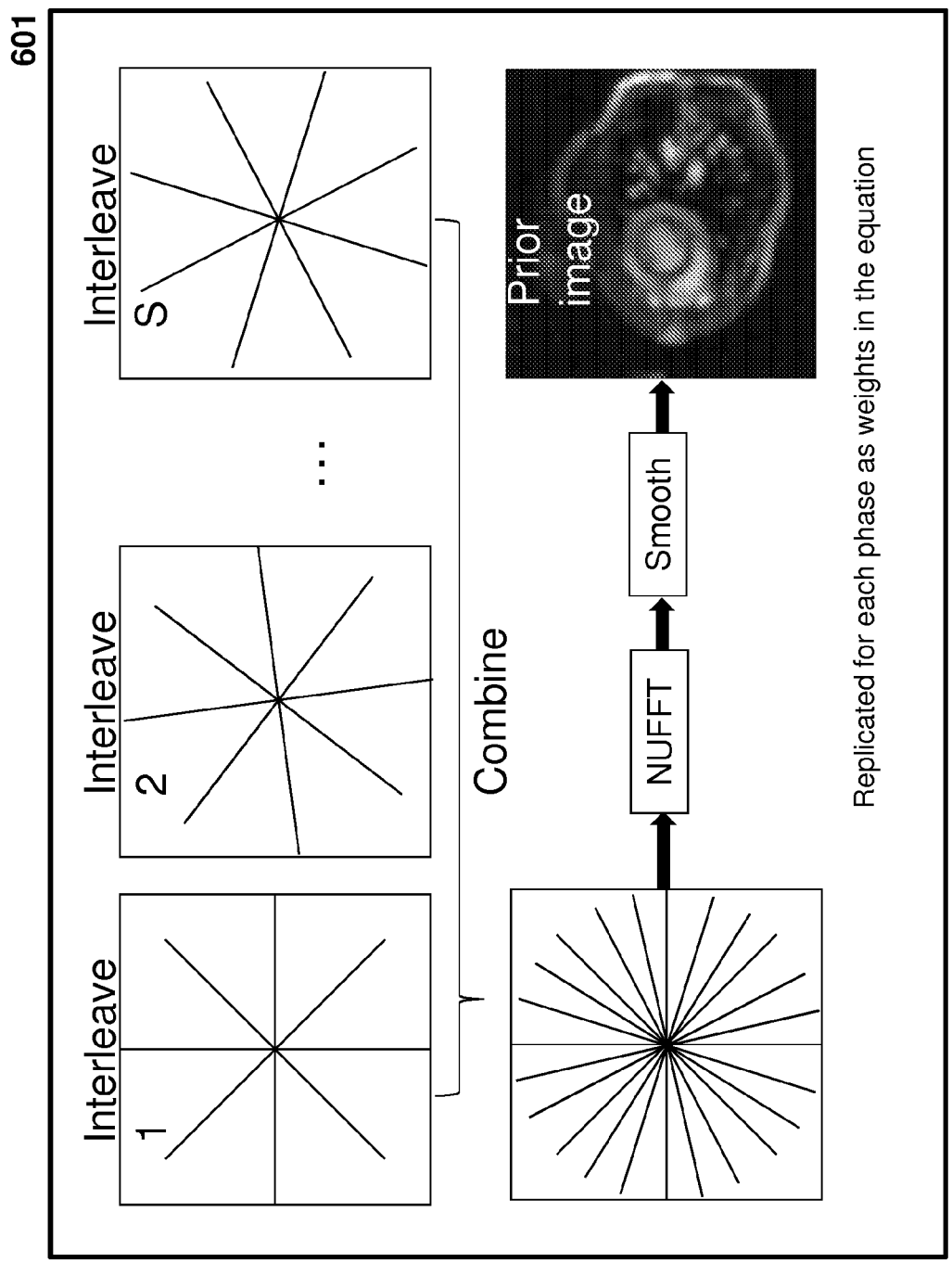
FIG. 6 illustrates generating a prior image in accordance with an aspect of the present invention.

The use of a filter on prior image data may be beneficial in simplifying some of the later processing. However, it is not required to filter a prior image. For instance, one can obtain a prior by interleaved sampling, for instance by rotationally interleaved sampling of a phase during acquisition. Creating a prior image from interleaved sampling is illustrated in FIG. 6 box 601. For each phase samples are acquired along (in this case) a rotated axis. In accordance with an aspect of the present invention the samples of the object, which are interleaved and preferably non-overlapping samples, over phases 1, 2, . . . S are combined into a single dataset which is transformed by a non-uniform FFT (NUFFT) into a single image, to generate a desired prior image in accordance with an aspect of the present invention. In a further embodiment of the present invention, the combined interleaved samples are smoothed by a filter, preferably after the data has been transformed by a NUFFT.

Each interleave can individually be used to reconstruct a phase or a frame. However, combining non-overlapping interleaves yields a good signal-to-noise ratio (SNR) and resolution. This combining is used to multiply the trial image in each temporal phase resulting from a single interleave, so no temporal resolution is sacrificed.

The equation E10 can thus be rewritten as:

$$\arg\min_f\{\|\phi(g\cdot f)\|_1 \text{ subject to } \|Af-y\|_2 \leq \epsilon\} \quad E11$$

wherein g is a prior image that contains an artifact free area. As in E10, f represents the trial image; g represents the estimate image; · represents the element-wise operation which can be a multiplication; g·f represents an intermediate data set generated from g and f; $\phi(g\cdot f)$ represents the transform of the intermediate data set.

Reconstruction of the image in accordance with E10 or E11 is an iterative process. The iteration starts with an initial trial image f. Based on an iterative step, the initial trial image is replaced by a new image, and so on. One may thus replace the term "trial image" with "iterative image", indicating that f is updated based on an iterative step.

Results

The PRINCE-CS framework was applied to dynamic 2D radial cardiac MRI data. The measurement data, obtained from a pig with high heart rate, were acquired by a Siemens (Magnetom Avanto 1.5 T) scanner with a (TrueFiSP sequence). For each frame, there are 16 projections with 256 samples each and 18 channels for parallel imaging. With TR-2.7 ms, the frame rate is about 23 fps. In a Matlab implementation, NUFFT as described in Fessler et al. Nonuniform Fast Fourier Transforms Using Min-Max Interpolation, IEEE T-SP, 51(2):560-74, February 2003. is applied to transform the data between k-space and the image domain, estimate coil sensitivity profiles in accordance with as described in D.

Walsh et al. Adaptive Reconstruction of Phased Array MR Imagery, MRM 2000, page 682-690 to combine all channels, and adopt NESTA as described in Becker et al., NESTA: A Fast and Accurate First-order Method for Sparse Recovery, SIAM J. on Imaging Sciences, 2011 page 1-39 to optimize expression E10. The following equations provide the iterative update of the NESTA method for the trial image:

$$m_k = \lambda(1-\gamma)A^*y + q_y - \gamma A^* A q_y,$$

$$\text{where } \gamma = \frac{\lambda}{\lambda+L} \text{ and } q_y = f_k - \nabla \xi(f_k)$$

$$n_k = \lambda(1-\gamma)A^*y + q_z - \gamma A^* A q_z,$$

$$\text{where } q_z = f_0 - \sum_{i,i \leq k} \alpha_i \nabla \xi(f_i), \alpha_i = \frac{1}{2}(k+1)$$

$$f_{k+1} = \tau_k m_k + (1-\tau_k) n_k,$$

$$\text{where } \tau_k = 2/(k+3).$$

Here, $m_k$ and $n_k$ are two intermediate images whose weighted sum yields the iterative image f; $\lambda$ and L are, respectively, Lagrange multiplier and Lipschitz constant; and $\nabla \xi(f_k)$ denotes the gradient of the cost function in E10.

Another efficient algorithm FISTA as described in A. Beck and M Teboulle: A fast iterative shrinkage-thresholding algorithm for linear inverse problems, SIAM J. on Imaging Sciences 2 (1), page 183-202 can also adopted to solve the equivalent formulation E2. With a smart choice of an intermediate image $m_k$, the convergence rate of FISTA is 1 order of magnitude faster than the conventional gradient based methods. The following equations provide the iterative update of the FISTA method for the trial image:

$$f_k = prox_L(m_k),$$

$$t_{k+1} = \frac{\left(1 + \sqrt{1+4t_k^2}\right)}{2},$$

$$m_{k+1} = f_k + \left(\frac{t_{k-1}}{t_{k+1}}\right)(f_k - f_{k-1})$$

$$\text{where } prox_L(m) = \varphi^*\left(\text{sgn}(\varphi(m))\max\left(|\varphi(m)| - \frac{\lambda}{L_k}, 0\right)\right),$$

with $L_k$ being the Lipschitz constant.

Figure 2:
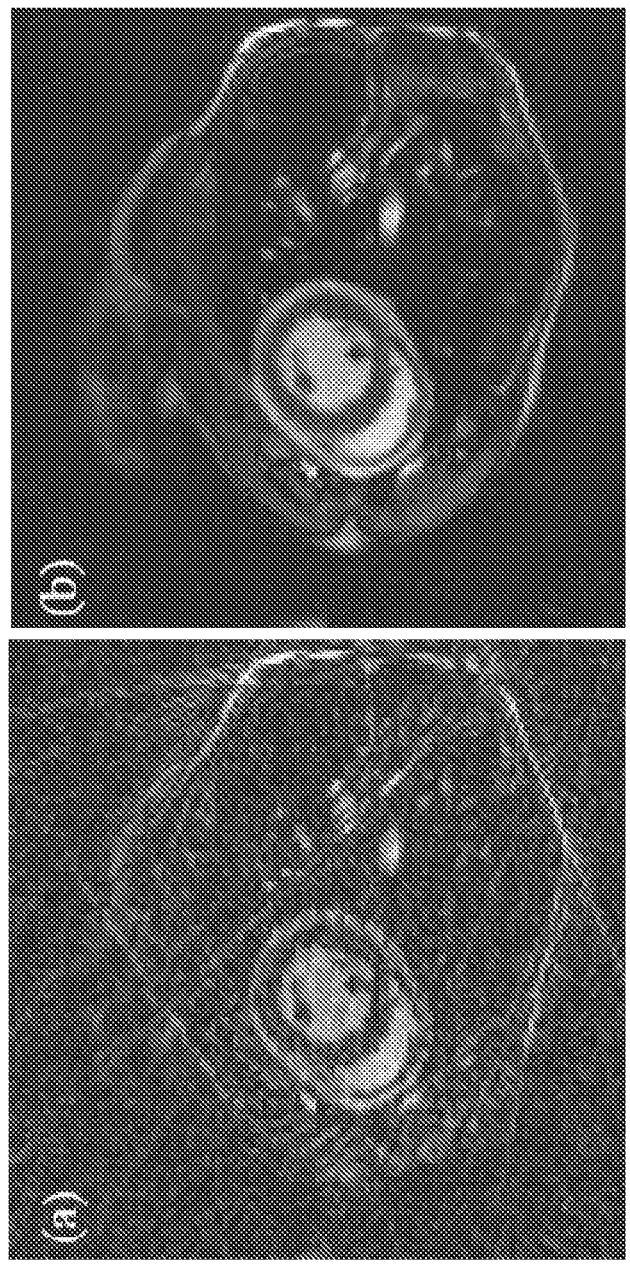
FIG. 2 illustrates reconstructed images containing artifacts.
Figure 3:
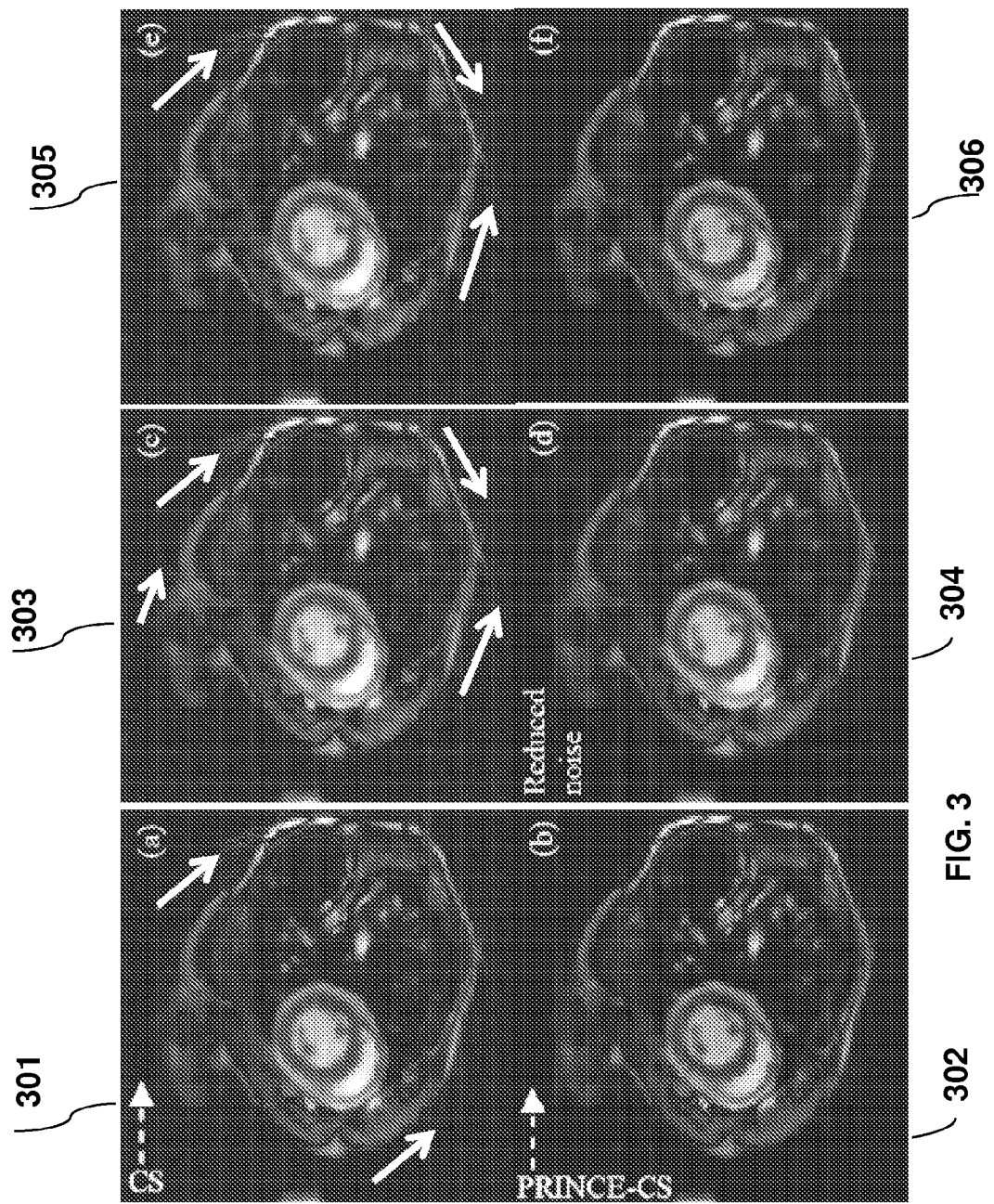
FIG. 3 illustrates reconstructed imaged in accordance with one or more aspects of the present invention.

FIGS. 2(a) and 2(b) show, respectively, the reconstruction of the first frame by the gridding method and k-t SENSE. These results provide evidences of how severe the aliasing artifacts are and how good the start-of-the-art is for the given data. A good result is shown in FIG. 3 302, where the temporal KLT is used in the PRINCE-CS framework in accordance with an aspect of the present invention. Comparing with the result of k-t SENSE, one can see that the aliasing artifacts are further suppressed and the Gaussian-like noise is virtually absent, both in the background and anatomical structures.

FIG. 3 illustrates a comparison between the conventional CS (top row, 301, 303 and 305), as in E9, and PRINCE-CS (bottom row 302, 304 and 306), as in E10. Each column has the same sparsifying transforms: 301 and 302 KLT in the temporal dimension, 303 and 304 spatial redundant Haar wavelet concatenated with temporal Off, and 305 and 306 spatial redundant Haar wavelet alone. With the additional prior, 302, 304, and 306 show the corresponding results with significantly reduced aliasing artifacts. These results imply that PRINCE-CS can be applied to applications in both static and dynamic applications. All results share the same parameters in the applied program for fair comparison.

The reconstructed images that apply one or more of the herein provided methods in accordance with one or more aspects of the present invention thus have noticeable fewer artifacts which may be called substantially fewer artifacts compared to known methods.

The concept of prior estimated CS was realized by introducing the nearly artifact-free estimate in the objective function with L1 sparsity. Although the quantitative impact of the prior in the context of CS framework has not been theoretically analyzed, experimentally, one can see that the reconstruction results for dynamic 2D radial cardiac MRI were improved under various settings. The use of KLT in the temporal dimension, together with a prior estimate and without any additional spatial transform is provided as an aspect of the present invention. This achieves high reconstruction quality wherein the aliasing artifacts are eliminated and the anatomy details are preserved.

It is believed that the proposed PRINCE-CS framework can benefit many other applications, where a rough prior reconstruction, be it low or high resolution, can be estimated and treated as an oracle to improve the standard CS formulation.

Figure 4:
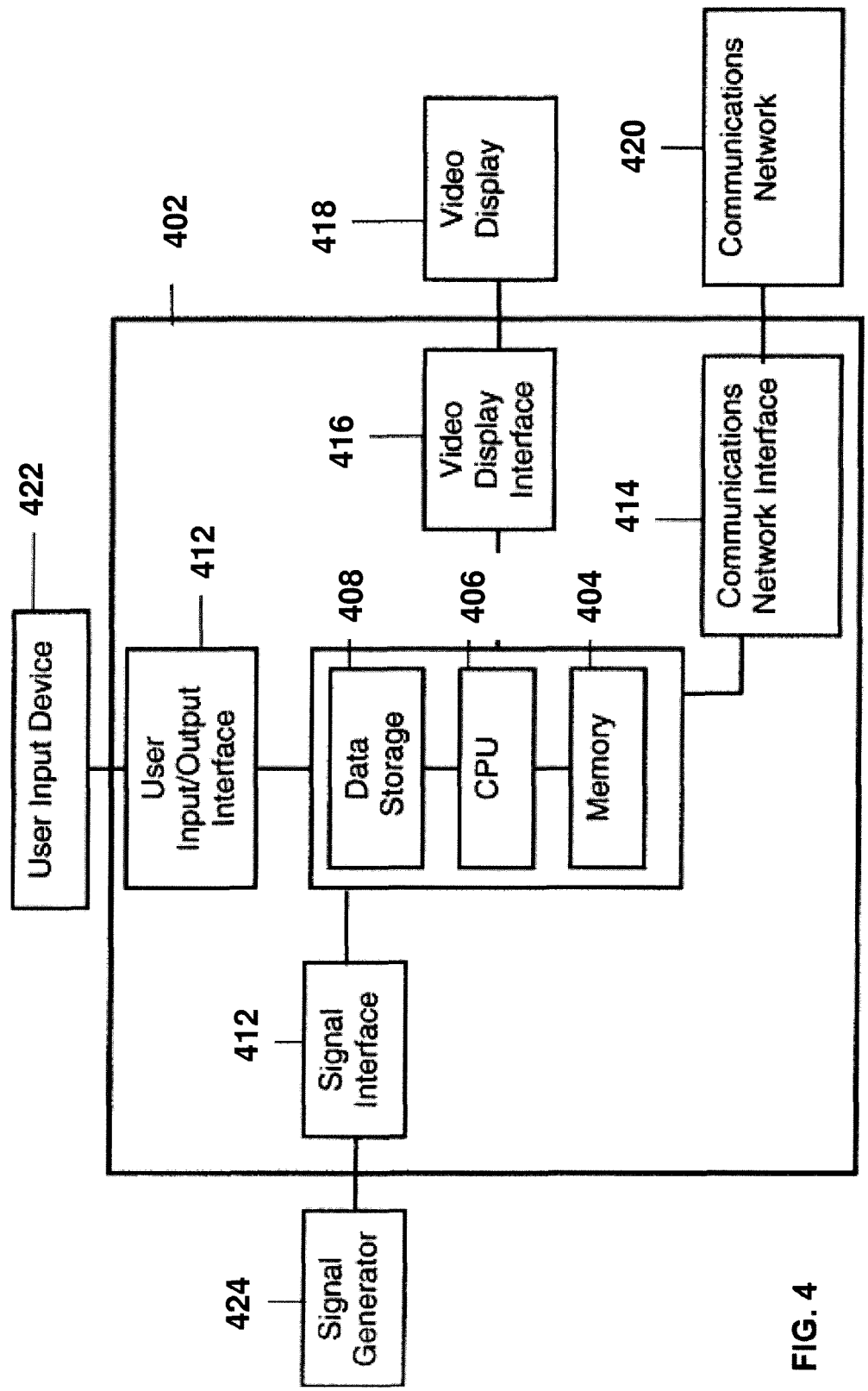
FIG. 4 illustrates a high-level schematic of a computer for performing image reconstruction.

One embodiment of an image processing system 110 (FIG. 1) is implemented by using a computer having a processor. As shown in FIG. 4, computer 402 may be any type of well-known computer comprising a central processing unit (CPU) 406, memory 404, data storage 408, and user input/output interface 410. Data storage 408 may comprise a hard drive or non-volatile memory. User input/output interface 410 may comprise a connection to a user input device 422, such as a keyboard or mouse. As is well known, a computer operates under control of computer software which defines the overall operation of the computer and applications. CPU 406 controls the overall operation of the computer and applications by executing computer program instructions which define the overall operation and applications. The computer program instructions may be stored in data storage 408 and loaded into memory 404 when execution of the program instructions is desired. Computer 402 may further comprise a signal interface 412 and a video display interface 416. Signal interface 412 may transform incoming signals, such as from measurement system 102 (FIG. 1), to signals capable of being processed by CPU 306. Video display interface 416 may transform signals from CPU 406 to signals which may drive video display 418. Computer 402 may further comprise one or more network interfaces. For example, communications network interface 414 may comprise a connection to an Internet Protocol (IP) communications network 420. Computers are well known in the art and will not be described in detail herein.

FIG. 5 summarizes some of the steps of the image reconstruction method as provided herein. Block 501 illustrates the known CS solving method. Block 502 illustrates the use of a prior in reconstruction. Block 503 illustrates some of the mathematical tools and includes the use of a weighting factor that changes for each reweighting iteration. Block 503 also includes the use of a Non-uniform Fourier Transform to form a temporal image and the NESTA algorithm for performing optimization steps.

The foregoing Detailed Description is to be understood as being in every respect illustrative and exemplary, but not restrictive, and the scope of the invention disclosed herein is not to be determined from the Detailed Description, but rather from the claims as interpreted according to the full breadth permitted by the patent laws. It is to be understood that the embodiments shown and described herein are only illustrative of the principles of the present invention and that various modifications may be implemented by those skilled in the art without departing from the scope and spirit of the invention. Those skilled in the art could implement various other feature combinations without departing from the scope and spirit of the invention.

The invention claimed is:

1. A method for generating a reconstructed image of an object from undersampled image data obtained with a medical imaging system, comprising:
   a processor receiving the undersampled image data obtained with the medical imaging system by radial imaging;
   the processor generating an estimate image by reconstructing a substantially artifact-free image from non-overlapping image data in the undersampled image data;
   the processor generating an intermediate data set by performing an element-wise operation on corresponding data elements in an iterative image and the estimate image;
   the processor generating the reconstructed image by minimizing a transform of the intermediate data set; and wherein
the minimizing is represented by an expression $$\arg\min_f\{\|\phi(g \cdot f)\|_1 \text{ subject to } \|Af - y\|_2 \le \epsilon\}, \text{ wherein}$$

f represents the iterative image;
g represents the estimate image;
• represents the element-wise operation;
g•f represents the intermediate data set;
$\phi(g \cdot f)$ represents the transform of the intermediate data set;
$\|\cdot\|_1$ represents an L1 norm;
$\|\cdot\|_2$ represents an L2 norm;
A represents a non-uniform Fourier operator that maps an image into k-space;
y is measured k-space data; and
$\epsilon$ is a parameter that accounts for deviation between measured and ideal data.

2. The method of claim 1, wherein the iterative image is updated in an iterative step.

3. The method of claim 1, wherein the image data obtained with the medical imaging system by radial imaging is dynamic 2D-radial cardiac image data.

4. The method of claim 1, wherein the transform is a Karhunen-Loeve transform that does not include a spatial sparsifying transform.

5. The method of claim 1, wherein the transform is a Karhunen-Loeve transform that does include a spatial sparsifying transform.

6. The method of claim 1, wherein the element-wise operation is a multiplication.

7. The method of claim 1, wherein the estimate image is generated by combining a plurality of interleaved samples of the object.

8. The method of claim 1, wherein the estimate image is obtained from non-overlapping spokes in a 2D radial k-space trajectory.

9. The method of claim 1, wherein the estimate image is a smoothed and substantially alias-free estimate of f.

10. A system to generate a reconstructed image of an object from undersampled image data obtained with a medical imaging system, comprising:
    a memory enabled to store data;
    a processor, enabled to execute instructions to perform the steps:
      receiving the undersampled image data obtained with the medical imaging system by radial imaging;
      generating an estimate image by reconstructing a substantially artifact-free image from non-overlapping image data in the undersampled image data;
      generating an intermediate data set by performing an element-wise operation on corresponding data elements in an iterative image and the estimate image;
      generating the reconstructed image by minimizing a transform of the intermediate data set; and wherein
the minimizing is represented by an expression $$\arg\min_f\{\|\phi(g \cdot f)\|_1 \text{ subject to } \|Af - y\|_2 \le \epsilon\}, \text{ wherein}$$

f represents the iterative image;
g represents the estimate image;
• represents the element-wise operation;
g•f represents the intermediate data set;
$\phi(g \cdot f)$ represents the transform of the intermediate data set;
$\|\cdot\|_1$ represents an L1 norm;
$\|\cdot\|_2$ represents an L2 norm;
A represents a non-uniform Fourier operator that maps an image into k-space;
y is measured k-space data; and
$\epsilon$ is a parameter that accounts for deviation between measured and ideal data.

11. The system of claim 10, wherein the iterative image is updated in an iterative step.

12. The system of claim 10, wherein the image data obtained with the medical imaging system by radial imaging is dynamic 2D-radial cardiac image data.

13. The system of claim 10, wherein the transform includes a Karhunen-Loeve transform and does not include a spatial sparsifying transform.

14. The system of claim 10, wherein the transform includes a Karhunen-Loeve transform and does include a spatial sparsifying transform.

15. The system of claim 10, wherein the element-wise operation is a multiplication.

16. The system of claim 10, wherein the estimate image is generated by combining a plurality of interleaved samples of the object.

17. The system of claim 10, wherein the estimate image is obtained from non-overlapping spokes in a 2D radial k-space trajectory.

18. A method for generating a reconstructed image of an object from image data obtained with a medical imaging system, comprising:
    a processor receiving the image data obtained with the medical imaging system by radial imaging;
    the processor generating an estimate image by reconstructing a substantially artifact-free image from non-overlapping image data;
    the processor generating an intermediate data set by performing an element-wise operation on corresponding data elements in an iterative image and the estimate image; and
    the processor generating the reconstructed image by minimizing a transform of the intermediate data set, wherein the minimizing is represented by an expression $$\arg\min_f\{\|\phi(g \cdot f)\|_1 \text{ subject to } \|Af - y\|_2 \le \epsilon\}, \text{ wherein}$$

f represents the iterative image;
g represents the estimate image;
• represents the element-wise operation;
g•f represents the intermediate data set;
$\phi(g \cdot f)$ represents the transform of the intermediate data set;
$\|\cdot\|_1$ represents an L1 norm;
$\|\cdot\|_2$ represents an L2 norm;

A represents a non-uniform Fourier operator that maps an image into k-space;

y is measured k-space data; and $\epsilon$ is a parameter that accounts for deviation between measured and ideal data.

* * * * *